United States Patent [19]
Felts

[11] Patent Number: 6,015,595
[45] Date of Patent: Jan. 18, 2000

[54] MULTIPLE SOURCE DEPOSITION PLASMA APPARATUS

[76] Inventor: John T. Felts, 2624 Calhoun St., Alameda, Calif. 94501

[21] Appl. No.: 09/086,715

[22] Filed: May 28, 1998

[51] Int. Cl.$^7$ ...................................................... B05D 1/02
[52] U.S. Cl. ........................... 427/446; 427/452; 427/456; 427/488; 427/489; 118/715; 219/119
[58] Field of Search ..................................... 427/446, 452, 427/456, 488–489; 118/715; 219/119

[56] References Cited

U.S. PATENT DOCUMENTS

| | | | |
|---|---|---|---|
| 4,422,915 | 12/1983 | Wielonski et al. | 204/165 |
| 4,475,063 | 10/1984 | Aston | 315/111.81 |
| 4,812,040 | 3/1989 | Marcus et al. | 356/314 |
| 5,114,556 | 5/1992 | Lamont, Jr. | 204/192.12 |
| 5,359,254 | 10/1994 | Arkhipov et al. | 313/15 |
| 5,531,834 | 7/1996 | Ishizuka et al. | 118/723 |

FOREIGN PATENT DOCUMENTS

WO 98/40531  9/1998  WIPO .

OTHER PUBLICATIONS

Bierderman, H. and Martinu, L., "Metal Doped Polymer Films Prepared In Low Pressure Reactive Plasmas" *Advances in Low Temperature Plasma Chemistry Technology and Application* edited by H.V. Boenig, 1, (1984) 37–48.

Dudney, N. et al., "Sputtering of lithium compounds for preparation of electrolyte thin films" *Solid State Ionics* (1992) 53–56:655–661.

Hudgens, J. and Martin, S., "Glass Transition and Infrared Spectra of Low–Alkali, Anhydrous Lithium Phosphate Glasses" *J. Am. Ceram. Soc.* (1993) 76[7]:1691–1696.

Knolle, W. and Allara, D., "Infrared Spectroscopic Characterization of Silicon Nitride Films—Optical Dispersion Induced Frequency Shifts" *Society for Applied Spectroscopy* (1986) 40[7]:1046–1049.

Schorn, R. et al., "A compact thermal lithium–beam source using a solid Al/Li alloy for Li sublimation" *Rev. Sci. Instrum.* (1989) 60[10]:3275–3279.

Shevyakov, A. et al., "A Study of Melts From The $Li_2O$–$SiO_2$ System with Respect To Their Structure And Crystallization Process Via High–Temperature Ir Spectroscopy" *Journal of Applied Chemistry* (1978) LI[11]:2612–2613 including English translation.

Smith, A. and Anderson, D., "Vibration Spectra of $Me_2SiCl_2$, $Me_3SiCl$, $Me_3SiOSiMe_3$, $(Me_2SiO)_3$, $(Me_2SiO)_4$, $(Me_2SiO)_x$, and Their Deuterated Analogs" *Society for Applied Spectroscopy* (1984) 38[6]:822–833.

White, D. et al., "Infrared Spectra and the Structures and Thermodynamics of Gaseous LiO, $Li_2O$, and $Li_2O_2$†" *The Journal Of Chemical Physics* (1963) 39[10]:2463–2473.

Xiaojie, X. et al., "A Study of Glass Structure In $Li_2O$–$SiO_2$, $Li_2O$–$Al_2O_3$–$SiO_2$ and Li–Al–Si–O–N Systems" *Journal of Non–Crystalline Solids* (1989) 112:80–84.

*Primary Examiner*—Bruce Breneman
*Assistant Examiner*—Norca L. Torres
*Attorney, Agent, or Firm*—Skjvern, Morrill, MacPherson, Franklin & Friel LLP; David E. Steuber

[57] ABSTRACT

An apparatus for forming a film on a substrate includes a gas inlet and an insert attached to the gas inlet, the insert including a deposition source material such as lithium. To form the film on the substrate, the substrate is mounted in a vacuum chamber. After the vacuum chamber is pumped clown to a subatmospheric pressure, a first process gas such as argon is provided through the gas inlet and insert and into a plasma region proximate the substrate. Power is then coupled to generate a plasma inside of the insert which heats the insert and causes the deposition source material to vaporize. The deposition source material vapor is mixed with a plasma polymerizable material in the plasma region proximate the substrate causing a plasma enhanced chemical vapor deposition (PECVD) thin film such as silicon oxide including the deposition source material (e.g. lithium) to be deposited on the substrate.

23 Claims, 2 Drawing Sheets

MULTIPLE SOURCE DEPOSITION PLASMA APPARATUS

FIELD OF THE INVENTION

The present invention relates generally to thin film processing and in particular to a method and apparatus for depositing a thin film onto a substrate.

BACKGROUND OF THE INVENTION

In recent years there has been great interest in the formation of metal doped polymer films. For example, it has been found that a thin-film coating having a desired color can be readily obtained by introducing metallic particulates into a plasma formed polymer.

Wielonski et al., U.S. Pat. No. 4,422,1315 (hereinafter Wielonski), herein incorporated by reference, discloses a method of forming a colored polymeric film-like coating. The film-like coating is formed by depositing a plasma-formed polymer concurrently with particulates. In particular Wielonski teaches that a plasma-polymerizable material is introduced into an electrical discharge region causing the plasma-formed polymer to be deposited. Concurrent with the formation of the plasma-formed polymer, the particulates are provided.

For providing the particulates, referring now to FIGS. 1, 2 and 3 of Wielonski, a filament resistance heater 29, an inductively heater evaporation source means 36, and an electron beam evaporator 40, respectively, are provided. (Filament resistance heater 29, source means 36 and electron beam evaporator 40 are hereinafter collectively referred to as evaporators.) However, these evaporators have several drawbacks.

One drawback is that each of the evaporators requires dedicated circuitry, e.g. power supplies, for powering the evaporators. Further, to couple the dedicated circuitry with the associated evaporator, one or more vacuum feedthroughs are necessary. Accordingly, the evaporators add complexity, decrease reliability and add cost to the apparatus.

Another drawback is that the evaporators waste the evaporated material and contaminate the process chamber. In particular, referring to Wielonski FIG. 1, evaporation material from filament heater element 29 has a tendency to not only to coat the substrate but also the rest of the apparatus. Thus some (if not most) of the evaporated material from filament heater element 29 ends up coating the inside of the apparatus instead of the substrate thus wasting the evaporation material. This is a particular disadvantage when the evaporation material is expensive, e.g. gold. Further, the buildup of evaporated material on the inside of the apparatus can flake thereby contaminating the apparatus including the substrate. The evaporators of FIGS. 2 and 3 of Wielonski suffer from the same drawbacks.

Accordingly, it is desirable to form a particulate containing polymeric coating using a method that does not require the use of dedicated circuitry to evaporate the particulate and does not waste evaporation material.

SUMMARY OF THE INVENTION

In accordance with the present invention, an apparatus for forming a thin film on a substrate includes a first gas inlet and an insert attached to the first gas inlet, the insert including a deposition source material such as lithium to be deposited on the substrate. The first gas inlet is coupled to a first process gas source which is typically a compressed gas cylinder of an inert gas such as argon.

The apparatus further includes a second gas inlet coupled to a second process gas source, the second process gas source including a first gas component source and a second gas component source. The first gas component source is typically a compressed gas cylinder of a reactive gas such as oxygen and the second gas component source is typically a container of organosilicon liquid such as hexamethyldisiloxane (HMDSO). Alternatively, the second process gas source is a container of organosilicon liquid and a reactive gas is not provided.

The apparatus further includes a conical shield attached to the first gas inlet and surrounding the end of the first gas inlet to which the insert is attached. The shield and first gas inlet are formed of an electrically conductive material and are electrically coupled to one another.

To form the thin film on the substrate, the substrate is mounted in a vacuum chamber formed of an electrically insulating material. After the vacuum chamber is pumped down to a subatmospheric pressure, the first process gas (e.g. argon) is provides through the insert which is shaped as an open ended hollow cylinder.

Power is then coupled to a main electrode adjacent an exterior surface of the vacuum chamber causing the first process gas within the insert to become ionized (i.e. to generate a plasma within the insert). Alternatively, instead of providing a main electrode adjacent an exterior surface of an electrically insulating vacuum chamber, the vacuum chamber is a grounded electrically conductive material and power is coupled to the first gas inlet and shield to ionize the first process gas inside of the insert. In either embodiment, the insert is heated causing the insert deposition source material (e.g. lithium) to vaporize from the insert forming deposition source material vapor (e.g. lithium vapor).

The deposition source material vapor mixes with the second process gas (e.g. oxygen and HMDSO or just HMDSO) provided from the second gas inlet in a shield plasma region defined by the shield. As a result, a PECVD thin film (e.g. silicon oxide) including the deposition source material (e.g. lithium) is deposited on the substrate.

Through the use of the shield, power coupling efficiency to the shield plasma region is higher than to the rest of the vacuum chamber volume resulting in a higher degree of ionization in the shield plasma region than in the rest of the vacuum chamber. Further, the shield concentrates the overall process gas mixture to the vicinity of the substrate. Accordingly, through the use of the shield, thin film deposition preferentially occurs on the substrate and not on the rest of the vacuum chamber avoiding waste of the insert material and the associated contamination of the vacuum chamber.

In one embodiment, an insert formed of an aluminum/lithium alloy is used to generate lithium vapor. Of importance, lithium vapor is generated without the use of pure lithium which is a chemically active and relatively hazardous material. Further lithium vapor is generated without having to provide an evaporator and the associated circuitry (e.g. power supplies) as in the prior art thus reducing the complexity, cost and increasing the reliability of the apparatus.

In another embodiment, a polymeric insert is used to introduce a polymer (e.g. polyethylene) into a PECVD formed thin film (e.g. silicon oxide). The structure is then heated to cause the polymer to vaporize and be removed from the PECVD formed thin film. The resulting thin film includes micro air gaps corresponding to the sites from which the polymer was vaporized. Accordingly, the resultant thin film has a low dielectric constant.

Advantageously, substantially any desired material can be incorporated into a PECVD formed thin film through the use of a suitable insert. Combined with the ability to readily change the PECVD formed thin film by varying the composition of the second process gas, any desired material can be incorporated into any desired PECVD formed thin film.

These and other objects, features and advantages of the present invention will be more readily apparent from the detailed description of the embodiments set forth below taken in conjunction with the accompanying drawings.

DETAILED DESCRIPTION

Figure 1:
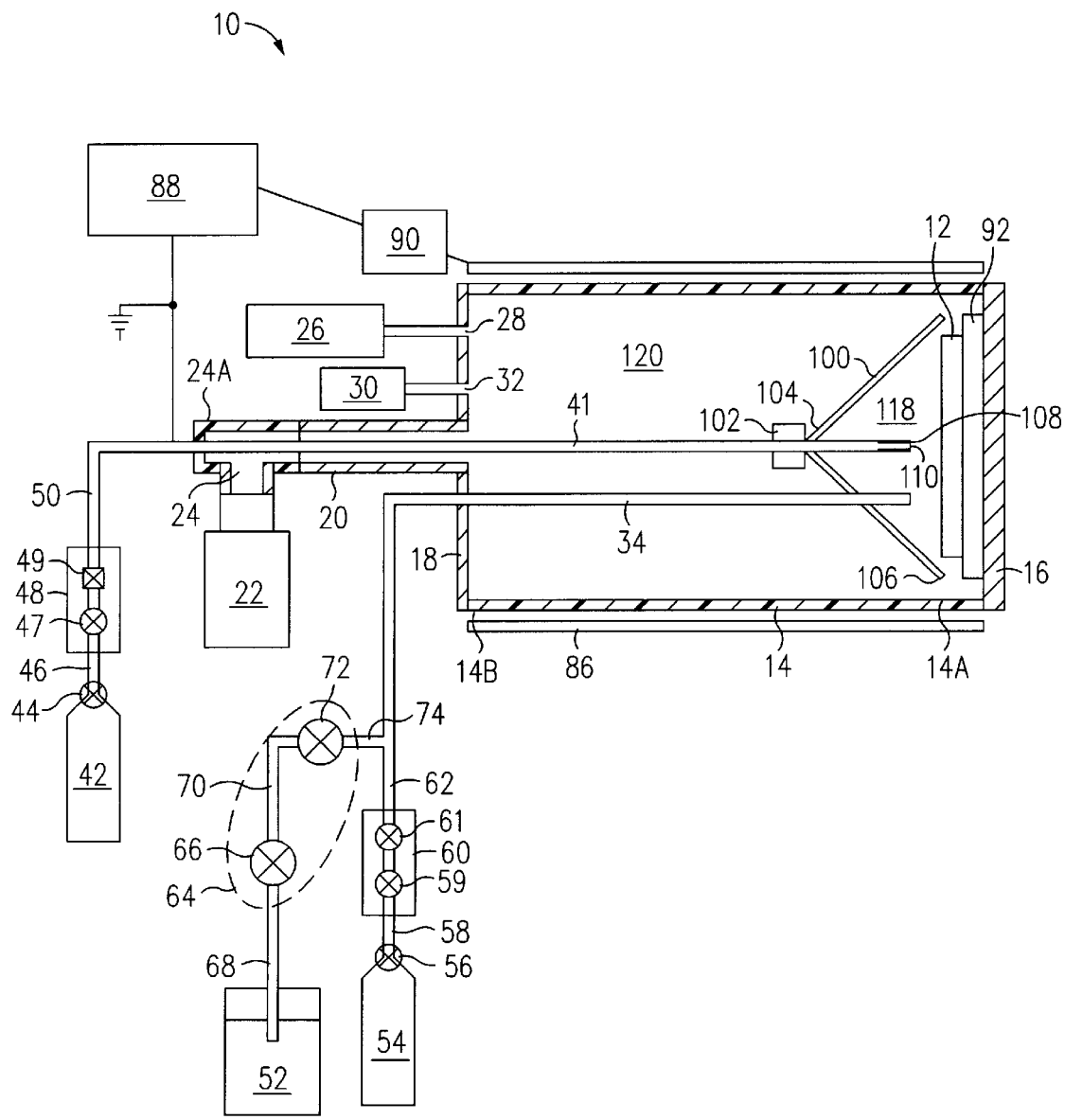
FIG. 1 is a cross-sectional view of a reactor system including a cylindrical chamber in accordance with the present invention.

FIG. 1 is a cross-sectional view of a reactor system 10 including a cylindrical chamber 14 in accordance with the present invention. Chamber 14 is made of an insulating material such as quartz although other insulating materials such as alumina or plastic can be used.

In this embodiment, the length of chamber 14, i.e. the distance from a first end 14A to a second end 14B of chamber 14, is 8.7 inches (in.) and the inner diameter of chamber 14 is 7.75 in.

Chamber 14 is fitted on first end 14A with a door 16 which can be opened and closed to allow access to the interior of chamber 14. When door 16 is closed, i.e. when door 16 is in contact with end 14A as shown in FIG. 1, a vacuum seal is formed between door 16 and second end 14A using conventional means such as by locating an O-ring between door 16 and end 14A. Mounted on door 16 is a substrate holder 92 having a substrate 12 mounted thereon.

A second end 14B of chamber 14 is vacuum sealed with a face plate 18 also using conventional techniques. A pumping plenum 20 is concentrically attached on a first end to face plate 18. Pumping plenum 20 is also attached on a second end to a vacuum pump 22 by a T-coupler 24. In this embodiment, vacuum pump 22 is a conventional single or 2-stage rotary type mechanical pump which is set up for oxygen service. (Oxygen service typically requires the use of a fluorinated vacuum pump oil.) T-coupler 24 is made of an electrically insulating material such as Teflon or another polymeric material although other electrically insulating materials such as ceramic can be used. T-coupler 24 is a Cole Parmer (Niles, Ill.) part #H-06482-88 Teflon PFA NPT (F) tee or a MDC Vacuum Product, Inc. (Hayward, Calif.) part #728007 PVC Tee with KF5O flanges (part #728007) for nominal 1.5 in. PVC pipe. During use, vacuum pump 22 removes gas from the inside of chamber 14 via pumping plenum 20 and T-coupler 24 thereby reducing the pressure within chamber 14 to a subatmospheric pressure.

The pressure within chamber 14 is measured by a pressure transducer 26 which is exposed to the interior of chamber 14 at a pressure port 28 of face plate 18. Alternatively, a capacitance manometer or a thermocouple gauge can be used in place of pressure transducer 26.

A vent valve 30 is also exposed to the interior of chamber 14 at a vent port 32 of face plate 18. When chamber 14 is at a subatmospheric pressure, vent valve 30 can be opened allowing air to be drawn into chamber 14 through vacuum port 32 thereby bringing the pressure within chamber 14 up to atmospheric pressure. Vent valve 30 can be plumbed (not shown) to an inert gas such as nitrogen thus allowing chamber 14 to be vented with an inert gas.

Process gases can be fed into chamber 14 in at least two locations. In particular, a first process gas is introduced into chamber 14 through a central gas inlet 41. A second process gas is introduced into chamber 14 through an offset gas inlet 34.

The first process gas is provided from a first process gas source 42 which is typically a standard compressed gas cylinder. In this embodiment, the first process gas is argon, although other gases, typically inert gases, can be used. Source 42 is coupled to central gas inlet 41 via a pressure regulator 44, a gas line 46, a gas flowmeter 48 and a gas line 50.

During use, regulator 44 reduces the pressure of the first process gas (which is at a relatively high pressure inside of source 42) and delivers the first process gas at a reduced pressure to gas line 46. The first process gas flows from regulator 44 through gas line 46 to gas flowmeter 48.

Gas flowmeter 48 functions to control the on/off flow of the first process gas and also functions to control the volumetric flow rate of the first process gas to chamber 14. In this embodiment, gas flowmeter 48 includes a conventional shutoff valve 47 (such as a ball valve) which is the on/off control for the first process gas and a conventional metering valve 49 (such as a needle vale) which controls the flowrate of the first process gas. During use, shutoff valve 47 is opened thereby allowing the first process gas to flow to metering valve 49. Metering valve 49 is adjusted manually to increase or decrease an internal orifice of metering valve 49 thereby to increase or decrease, respectively, the volumetric flow rate of the first process gas. From flowmeter 48 (metering valve 49), the first process gas flows through gas line 50 to central gas inlet 41 and into chamber 14.

In this embodiment, the second process gas is a gas mixture having a first gas component provided from source 54 and a second gas component provided from source 52. Source 52 is a container of organosilicon liquid. Suitable organosilicon liquids include siloxanes such as hexamethyldisiloxane (HMDSO), 1,1,3,3-tetramethyldisiloxane (TMDSO), and octamethylcyclotetrasiloxane; alkoxysilanes such as amyltriethoxysilane, ethyltriethoxysilane, isobutyltriethoxysilane, and tetramethoxysilane; silazanes such as hexamethyldisilazane; and fluorine-containing silanes such as trimethyfluorosilane. The container of source 52 preferably has a cover to prevent contaminants from falling into the reservoir of organosilicon liquid. However, to allow the organosilicon liquid to be removed from source 52 by liquid line 68, air (or another gas such as nitrogen) must be allowed to enter source 52 as the organosilicon liquid is removed. Source 54 is typically a standard compressed gas cylinder.

As shown in FIG. 1, source 54 is coupled to offset gas inlet 34 via a pressure regulator 56, a gas line 58, a gas flowmeter 60 and a gas line 62. Offset gas inlet 34 passes through face plate 18 and forms a vacuum seal with face plate 18 using conventional vacuum technology.

Since source 54 is generally a reactive gas, and typically an oxidizing gas such as oxygen, pressure regulator 56, gas line 58, gas flowmeter 60 and gas line 62 are manufactured to service oxidizing gases as those skilled in the art will understand. During use, regulator 56 reduces the pressure of the first gas component (which is at a relatively high pressure inside of source 54) and delivers the first gas component at a reduced pressure to gas line 58. The first gas component flows from regulator 56 through gas line 58 to gas flowmeter 60. In this embodiment, gas flowmeter 60 is substantially identical to gas flowmeter 48 and functions in a similar manner to control the on/off and volumetric flow of the first gas component to offset gas inlet 34. In particular, gas flowmeter 60 includes a shutoff valve 59 and a metering valve 61. From flowmeter 60 (metering valve 61), the first gas component flows through gas line 62 to offset gas inlet 34.

The second gas component is provided to offset gas inlet 34 from source 52 via a vaporizer/flowcontroller system 64, hereinafter referred to as VF system 64. VF system 64 includes a liquid shutoff valve 66, a metering valve 72 and a heated tube 70 coupled on a first end to valve 66 and on a second end to valve 72. As shown in FIG. 1, shutoff valve 66 is coupled to liquid line 68 which extends into the reservoir of organosilicon liquid in source 52. Metering valve 72 is coupled to offset gas inlet 34 by a gas line 74. Heated tube 70 is typically a stainless steel cube which is heated using conventional heating tape.

Although the present invention is not limited by any theory of operation, it is believed that VF system 64 operates as follows. When reactor system 10 is initially setup, heated tube 70 and liquid line 68 contain air and are at atmospheric pressure. Liquid line 68 is then inserted into the organosilicon liquid reservoir in source 52.

As described in more detail below, chamber 14 is then evacuated by vacuum pump 22 which creates a vacuum in offset gas inlet 34. Metering valve 72 is When opened slightly, creating a corresponding vacuum in heated tube 70. Shutoff valve 66 is then opened to draw the organosilicon liquid from source 52 through liquid line 68 into heated tube 70. The inner diameter and length of liquid line 68 are selected such that, after organosilicon liquid is drawn into heated tube 70, no air remains in liquid line 68, i.e. that liquid line 68 is filled with purely organosilicon liquid. Preferably, the inner diameter and length of liquid line 68 are less than or equal to 0.125 in. and 3.0 feet, respectively. In one embodiment, the inner diameter and length of liquid line 68 are 1/32 in. (0.031 in.) and 2.0 feet, respectively.

Metering valve 72 is then shut. At this point, liquid line 68 and heated tube 70 are filled with purely organosilicon liquid (no air). In particular, heated tube 70 holds and heats organosilicon liquid.

As described in more detail below, during processing of substrate 12, a vacuum is created in offset gas inlet 34. Metering valve 72 is then opened thereby drawing some of the heated organosilicon liquid out of heated tube 70 into the subatmospheric pressure region of offset gas inlet 34. As the organosilicon liquid is exposed to the subatmospheric pressure, the organosilicon liquid boils thus producing organosilicon vapor. The flow rate at which the organosilicon vapor is delivered is controlled by adjusting metering valve 72.

As the organosilicon liquid is drawn from heated tube 70, additional organosilicon liquid from liquid line 68 and source 52 is drawn into heated tube 70 thus preventing heated tube 70 from running out of organosilicon liquid. In this manner, organosilicon vapor can be provided from VF system 64 over an extended period of time.

In the above description, valves 49, 61 and 72 are described as metering valves. However, in an alternative embodiment, valves 49 and 61 are replaced with fixed orifices which are sized to provide the predetermined flow of the first process gas and the first gas component, respectively. Also, valve 72 is replaced with a shutoff valve which has a fixed orifice (or in combination with a fixed orifice) which is sized to provide the predetermined flow of the second gas component. Alternatively, flowmeters 48 and 60 can be replaced with electronic mass flow controllers. Further, VF system 64 can be replaced with a conventional vaporizer system.

A main electrode 86 is provided adjacent the exterior surface of chamber 14. Main electrode 86 can be fashioned in a variety of shapes. For example, main electrode 86 can be a continuous coil or can be a plurality of separate cylindrical sections. In this embodiment, main electrode 86 is made of copper and is in the shape of a continuous cylinder. To allow main electrode 86 to fit over chamber 14, the inner diameter of main electrode 86 is slightly larger than the outer diameter of chamber 14. Preferably, main electrode 86 fits tightly over chamber 14. In this manner, any gap between main electrode 86 and chamber 14 is minimized and the power coupling efficiency from main electrode 86 to process gas within chamber 14 is maximized.

Main electrode 86 is powered by a conventional power supply 88. Power supply 88 is generally an alternating current (AC) power supply and preferably operates at 13.56 megahertz (MHz) output frequency (typically referred to as a radio frequency or RF power supply). To match the impedance of power supply 88 to the impedance of the process, a matching network 90 is coupled between power supply 88 and main electrode 86. In this embodiment, the output impedance of power supply 88 is 50 ohms and matching network 90 is a conventional LC type matching network. For example, power supply 88 is a 250 watt, 13.56 MHz generator available from RF Plasma Products and matching network 90 is the corresponding matching network also available from RF Plasma Products. To complete the electrical circuit, power supply 88 is also electrically coupled to central gas inlet 41 which, in addition to delivering the first process gas to chamber 14, operates as a counter electrode for power supply 88. As shown in FIG. 1, central gas inlet 41 is also coupled to ground.

To allow central gas inlet 41 to operate as a counter electrode, central gas inlet 41 is made of an electrically conductive material. In this embodiment, central gas inlet 41 is a hollow stainless steel tube.

Central gas inlet 41 extends through T-coupler 24 and pumping plenum 20, and into chamber 14. An air to vacuum seal is formed, for example by an O-ring, between T-coupler 24 and central gas inlet 41 at a first end 24A of T-coupler 24. Since T-coupler 24 is made of an electrically insulating material, gas inlet 40 is electrically isolated from chamber 14, pumping plenum 20, face plate 18 and the associated components. Further, gas line 50 is typically formed from an electrically insulating material such as plastic thus electrically isolating central gas inlet 41 from source 42 and the associated gas delivery system.

In an alternative embodiment, Chamber 14 is an electrically conductive material which is connected to ground, main electrode 86 is not provided and central gas inlet 41 and shield 100 are not grounded. In accordance with this embodiment, power supply 88 powers central gas inlet 41 and shield 100 instead of main electrode 86. In all other aspects, processing in accordance with this alternative embodiment is substantially similar to the processes described below.

Referring back to the embodiment of FIG. 1, surrounding the distal end 108 (i.e. the end opposite T-coupler 24) of central gas inlet 41 is a shield 100 attached to central gas inlet by a shield coupler 102. In this embodiment, shield 100 is in the shape of a cone having an apex 104 attached to central gas inlet 41. The base 106 of shield 100 is typically located proximate to substrate 12 and more particularly, in this embodiment, base 106 is laterally aligned with substrate 12. In other embodiments, base 106 does not laterally extend to substrate 12 (i.e. is laterally located between coupler 102 and substrate 12) or extends beyond substrate 12 (e.g. is laterally aligned with substrate holder 92).

Shield 100 and coupler 102 are formed of an electrically conductive material such as stainless steel or aluminum and are electrically coupled to one another and to central gas inlet 41. Shield 100 can also be mechanically attached or welded directly to central gas inlet 41 thus avoiding the use of coupler 102. In either embodiment, central gas inlet 41 and shield 100 are electrically coupled to one another and also to ground.

As shown in FIG. 1, offset gas inlet 34 extends from face plate 18 through an aperture in shield 100 between apex 104 and base 106. In this embodiment, offset gas inlet 34 is an electrically insulating material, e.g. glass, thus avoiding power coupling to offset gas inlet 34. However, in other embodiments, offset gas inlet is an electrically conductive material, e.g. stainless steel.

Figure 2:
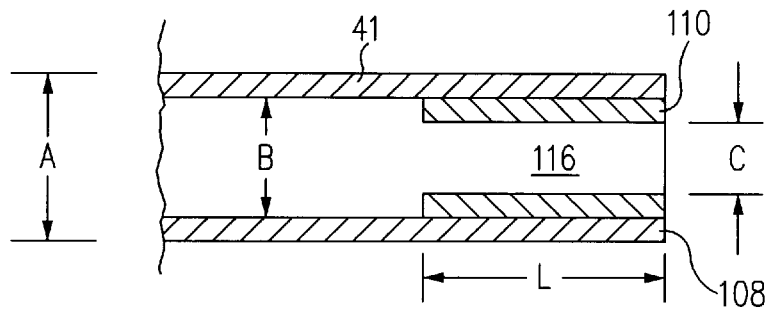
FIG. 2 is an enlarged cross-sectional view of the distal end of a central gas inlet and an insert of the apparatus of FIG. 1 in accordance with the present invention.

Contained within central gas inlet 41 at distal end 108 is an insert 110 shaped as a hollow open ended cylinder. Referring now to FIG. 2, an enlarged cross-sectional view of distal end 108 of central gas inlet 41 and insert 110 is illustrated. As best seen in FIG. 2, the outer diameter of insert 110 is approximately equal to the inner diameter of central gas inlet 41 such that insert 110 slips into central gas inlet 41 forming a compression fit between the outer surface of insert 110 and the inner surface of central gas inlet 41. In one embodiment, dimension A is 0.25 in., dimension B is 0.19 in., dimension C is 0.125 in. and dimension L is 1.0 in., where dimension A is the outer diameter of central gas inlet 41, dimension B is the inner diameter of central gas inlet 41, dimension C is the inner diameter of insert 110 and dimension L is the length of insert 110. However, it is understood that an insert 110 and a central gas inlet 41 having other dimensions A, B, C and L can also be used.

Although insert 110 is flush with distal end 108 of central gas inlet 41 in FIG. 2, in other embodiments insert 110 extends from (sticks out of) central gas inlet 41 or, alternatively, is located at a distance inside of central gas inlet 41. Further, insert 110 can be attached to central gas inlet 41 in other ways. For example, insert 110 can have an inner diameter greater than the outer diameter of central gas inlet 41 and can be mounted on central gas inlet 41 by slipping distal end 108 of central gas inlet 41 partially into insert 110. In other embodiments, insert 110 is attached to central gas inlet 41 by a coupler or alternatively is integral with central gas inlet 41.

As described further below, insert 110 provides a source material for deposition on substrate 12. In this embodiment, insert 110 is an aluminum-lithium alloy such as a 91% aluminum, 8% lithium allows available from Alcoa.

In accordance with the present invention, a method of coating substrate 12 is presented. Suitable examples of substrate 12 include silicon wafers, flat pieces of glass and sheets of copper. In this embodiment, the first process gas is argon and the second process gas is HMDSO (i.e. no reactive gas component in the second process gas in this embodiment). Further, insert 110 is a 91% aluminum, 8% lithium alloy (hereinafter referred to as an aluminum/lithium alloy).

Referring back to FIG. 1, initially, chamber 14 is at atmospheric pressure and there is no substrate in chamber 14. Door 16 is then opened and substrate 12 is mounted onto substrate holder 92. Door 16 is then shut.

Mechanical pump 22 is then turned on to pimp down chamber 14 to a subatmospheric pressure typically in the range of 0.050 torr to 1.000 torr and preferable to 0.010 torr or less. This subatmospheric pressure is measured by pressure transducer 26.

The argon and HMDSO process gases are then introduced into chamber 14 by opening shutoff valve 47 and metering valve 72 (shutoff valve 59 remains closed in this embodiment). Preferably, the argon and HMDSO process gases are introduced into chamber 14 when the pressure in chamber 14 reaches 0.100 torr.

The argon process gas flowrate is set to between 1 standard cubic centimeter per minute (SCCM) and 1000 SCCM and preferably is set to 20 SCCM. In particular, the argon process gas flowrate is set such that the chamber pressure is within the range of 0.050 torr to 10.000 torr, preferably 0.100 torr. As discussed above, the argon process gas flowrate is controlled by adjustment of metering valve 49.

The HMDSO process gas flowrate is generally set to between 1 SCCM to 1000 SCCM and preferably is set to 5 SCCM. As discussed above, the HMDSO gas flowrate is controlled by adjustment of metering valve 72.

After the argon and HMDSO process gas flows have stabilized (approximately 1.0 second), power supply 88 is turned on and AC power is coupled to main electrode 86. This ionizes the gases in chamber 14 as discussed further below. If necessary, matching network 90 is adjusted to match the impedance of the power supply 88 to the impedance of the resultant process plasmas. The process power is set to between 0.5 and 5.0 watts per square centimeter of substrate 12. Preferably, for a 100 $cm^2$ substrate 12, the process power is set 150 watts.

Although the present invention is not limited by any theory of operation, it is believed that power coupling produces at least three plasma regions.

Referring to FIG. 2, a first plasma region 116 (hereinafter an insert plasma region 116) is defined by insert 110. Initially, before power coupling, argon is flowing through central gas inlet 41 and through insert 110. Power is then coupled (power supply 88 of FIG. 1 is turned on) to main electrode 86. This causes an argon plasma to be generated within insert plasma region 116.

The argon plasma rapidly heats insert 110 due to ion and electron bombardment. In particular, insert 110 is heated to a temperature above the sublimation temperature of the lithium component of the aluminum/lithium alloy yet below the melting temperature of the aluminum/lithium alloy, where the sublimation temperature of a material is defired as the temperature where the material directly passes from solid to vapor without appearing in the intermediate (liquid) state. Generally, insert 110 is heated to a temperature in the range of 450° C. to 625° C.

Upon being heated, the lithium component of insert 110 begins to volatilize thereby producing monatomic lithium vapor. Evaporation of lithium from an aluminum/lithium alloy is discussed in Schorn et al., "A compact thermal lithium-beam source using a solid Al/Li alloy for Li sublimation," Rev. Sci. Instrum., vol. 60, No. 10, pgs. 3275–3279, herein incorporated by reference in its entirety. The lithium atoms from insert 110 enter insert plasma region 116 and become excited, i.e. one or more lithium electrons change state, due to interactions with the argon plasma in insert plasma region 116. The excited lithium atoms are then entrained along with the argon gas out of central gas inlet 41 and into a second plasma region 118 illustrated in FIG. 1.

Of importance, lithium vapor is generated without the use of pure lithium which is a chemically active and relatively hazardous material. Further, lithium vapor is generated without having to provide an evaporator and associated circuitry as in the prior art reducing the complexity, cost and increasing the reliability of the apparatus.

Referring now to FIG. 1, second plasma region 118 (hereinafter shield plasma region 118) is defined by shield 100. Substrate 12 is located in shield plasma region 118 or, alternatively, is located adjacent to shield plasma region 118. As shown in FIG. 1, the longitudinal axis of central gas inlet 41 is substantially perpendicular to, and directed at, substrate 12. Accordingly, the excited lithium atoms are directed at substrate 12.

Also entering shield plasma region 118 from offset gas inlet 34 is the HMDSO process gas. The HMDSO process gas mixes with the argon/lithium vapor gas mixture from central gas inlet 41, the resulting gas mixture being ionized in shield plasma region 118 due to power coupling from power supply 88.

It is believed that the plasma generated in shield plasma region 118 decomposes the HMDSO vapor breaking off the methyl groups-as well as some Si—O bonds. The oxygen generated in the decomposition of the Si—O oxidizes the methyl groups and any other organic groups formed thus enhancing the volatilization and gas phase removal to pump 22 of these groups. Further, the oxygen generated in the decomposition of the Si—O oxidizes the condensable siloxane backbone (Si—O—Si) resulting from the HMDSO decomposition to form a plasma enhanced chemical vapor deposition (PECVD) thin film of silicon oxide (SiO$_x$ where x is approximately equal to 2.0). The lithium atoms which are directed at substrate 12 are incorporated into this PECVD thin film of silicon oxide, with the net result being the formation of a silicon oxide thin film containing lithium on substrate 12, hereinafter referred to as a nanomatrix™ lithium thin film. Of importance, excitation of the lithium atoms transfer large amounts of energy to the growing thin film. This enhances the properties of the nanomatrix™ lithium thin film, e.g. increases the density.

Shield 100 further enhances the formation of the nanomatrix™ lithium thin film by increasing the power coupling efficiency to shield plasma region 118 resulting in a higher degree of excitation and ionization of the plasma in shield plasma region 118 compared to a plasma generated without shield 100. Further, shield 100 concentrates the process gas mixture to the vicinity of substrate 12 thus preferentially causing the nanomatrix™ lithium thin film to be deposited on substrate 12 and not on the rest of chamber 14.

The power coupling also generates a plasma in a third plasma region 120 (hereinafter chamber plasma region 120) defined by the region inside of chamber 14 and outside of shield plasma region 118. Spent process gas from shield plasma region 118 is pumped off through chamber plasma region 120 to vacuum pump 22. However, the spent process gas is substantially depleted of HMDSO and lithium thus very little film formation occurs in chamber plasma region 120. Film formation is further inhibited in chamber plasma region 120 since the plasma is weakly ionized in chamber plasma region 120 compared to shield plasma region 118. Accordingly, by utilizing shield 100, very little of the material of insert 110 (i.e. lithium) is wasted due to deposition on chamber 14 and system contamination from deposition on chamber 14 is also reduced or eliminated.

After a predetermined amount of time, generally 1 to 300 seconds and typically 5 to 45 seconds, power supply 88, the argon and HMDSO process gas flows and mechanical pump 22 are shut off. To shut off the argon and HMDSO process gases, shutoff valve 47 and metering valve 72 are closed. Chamber 14 is then vented to atmospheric pressure by opening vent valve 30.

When chamber 14 reaches atmospheric pressure as measured by pressure transducer 26, door 16 is opened. Substrate 12 is then removed and a new substrate 12 is loaded on to substrate holder 92 and processed.

Figure 3:
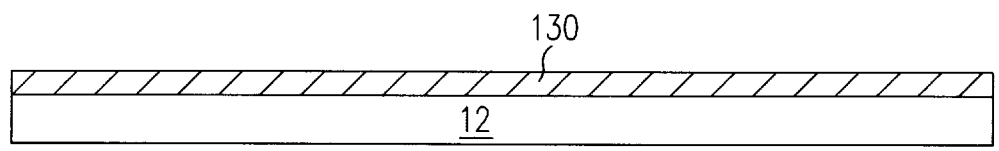
FIG. 3 is a cross-sectional view of a substrate having a nanomatrix™ thin film deposited thereon in accordance with one embodiment of the present invention.

FIG. 3 is a cross-sectional view of substrate 12 having a nanomatrix™ thin film 130 deposited thereon in accordance with the present invention. In this embodiment, film.130 is a silicon oxide containing lithium thin film. Advantageously, film 130 exhibits the physical characteristics of silicon oxide, e.g. mechanical strength, thermal stability, yet is electrically conductive due to the lithium incorporation. In particular, it is believed that the lithium atoms provide free electrons causing electrical conductivity of film 130 due to electron conductivity. Further, it is believed that the lithium atoms themselves can move in the silicon oxide matrix causing electrical conductivity of film 130 due to ion conductivity. Ion conductivity is particularly advantageous for use in electrochemical applications, e.g. for use in batteries.

Film 130 can also be used as a protective or passivation layer. For example, film 130 can be deposited on lithium metal thus protecting the lithium metal from the ambient environment (e.g. from oxidation).

In this embodiment where HMDSO process gag is used, the resultant nanomatrix™ thin film 130 is primarily silicon oxide which typically contains a small percentage of carbon and/or hydrogen and also contains lithium from insert 110. However, in other embodiments, nitrogen or fluorine can be incorporated into nanomatrix™ thin film 130 for example by using a nitrogen containing organosilicon liquid such as hexamethydisilazane or a fluorine containing organosilicon liquid such as trimethyfluorosilane, respectively.

Alternatively, instead of using an organosilicon liquid, source 52 (FIG. 1) can be any plasma polymerizable material. For example, source 52 can be a hydrocarbon such as methane or propane. In this alternative, the resultant nanomatrix™ thin film 130 (FIG. 3) is a thin film primarily containing carbon. As another alternative, source 52 (FIG. 1) can be an organometallic such as tetramethyltin.

Further, in other embodiments, the second process gas can include a first gas component such as oxygen and a second gas component such as HMDSO. Generally, in accordance with these other embodiments, the first gas component of the second process gas is a reactive gas. For example, the first gas component is oxygen or a fluorine-based compound such as carbon tetrafluoride ($CF_4$). Examples of other suitable fluorine-based compounds include: aliphatic fluorohydrocarbons such as perfluorotetradecane; aromatic fluorohydrocarbons such as fluorobenzene; benzotrifluorides such as 3-(trifluoromethyl)benzyl alcohol; fluroalkenes/alkynes such as hexafluoropropene trimer; (Meth)acrylate monomers such as hexafluoroisopropyl acrylate; fluoroalcohols and phenols such as hexafluoroisopropanol; fluorine-containing ethers such as trifluoromethoxy benzene; fluorine-containing ketones such as hexafluoracetone; fluoroacids and anhydrides such as difluoroacetic acid; fluoroaldehydes such as pentafluorobenzaldehyde; fluoroesters such as ethyl trifluoroacetate; fluorine containing nitrides such as pentafluorobenzonitrile; inorganic fluorine compounds such as silver fluoride; and fluorine-containing silanes such as trimethylfluorosilane.

Further, the first gas component of the second process gas can be another gas such as nitrogen ($N_2$), nitrous oxide ($N_2O$) or an organometallic such as tetramethyltin. Further, the first gas component can itself be a gas mixture, for example can be a mixture of nitrous oxide and oxygen.

In other embodiments, other inserts 110 can be used. For example, metallic, polymeric and ceramic inserts can be used. Examples of polymeric inserts include polyethylene, polypropylene and polytetrafluoroethylene (PTFE) inserts. The mechanism by which the material of the insert is vaporized depends upon the particular material. Examples include sublimation, sputtering and evaporation.

Advantageously, substantially any desired particulate can be incorporated into a PECVD formed thin film through the use of a suitable insert 100. Generally, insert 110 should be made of a material which can be sufficiently heated to produce a vapor without melting and dripping out of central gas inlet 41. Combined with the ability to readily change the PECVD formed thin film by varying the first and second components of the second process gas (i.e. sources 54, 52, respectively), any desired particulates can be incorporated into any desired PECVD formed thin film.

As an illustration, set forth above is an example where an Al/Li insert and a HMDSO process gas are used to form a PECVD silicon oxide thin film containing lithium. However, an alumina ceramic insert can be used instead of an Al/Li insert resulting in a PECVD silicon oxide thin film containing alumina. As a further alternative, an Al/Li insert can be used but the second process gas can be a gas mixture including hexamethyldisilazane (instead of HMDSO) and nitrogen, resulting in a PECVD silicon nitride thin film containing lithium.

Figure 4:
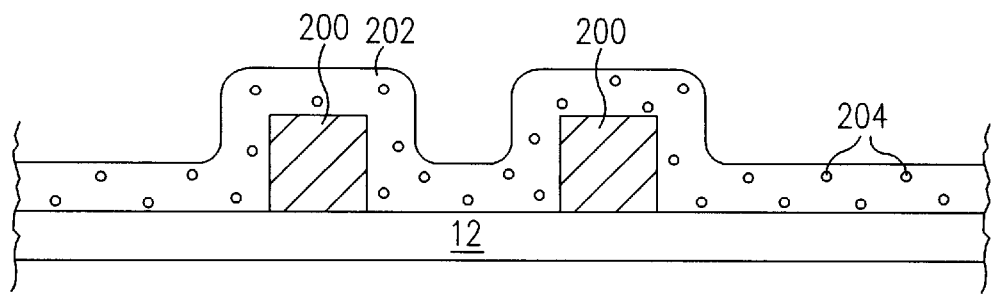
FIG. 4 is a cross-sectional view of a substrate having metal lines and a low dielectric constant film formed thereon in accordance with another embodiment of the present invention.

FIG. 4 is a cross-sectional view of substrate 12 having metal lines 200 and low dielectric constant (low-k) film 202 formed on substrate 12 in accordance with another embodiment. Metal lines 200 are formed using conventional techniques such as by selectively etching an electrically conductive layer on substrate 12.

Referring to FIGS. 1 and 4, low-k film 202 is formed using a polymeric insert 110 such as a polyethylene insert 110 and an organosilicon liquid such as HMDSO or octamethylcyclotetrasiloxane as source 52 (no reactive gas component in this embodiment). Processing proceeds as described above and results in a PECVD thin film silicon oxide matrix containing polyethylene. The entire structure is then heat treated, e.g. at 200° C., to cause the polyethylene to vaporize and be removed from the silicon oxide matrix, leaving low-k film 202.

Of importance, micro air gaps 204 are produced in low-k film 202 corresponding to the sites from which the polyethylene was removed due to vaporization. Since air has a dielectric constant approximately equal to 1.0, micro air gaps 204 in low-k film 202 cause low-k film 202 to have a low dielectric constant, e.g. less than 3.0. Low-k film 202 is particularly useful in minimizing parasitic capacitance between metal lines 200 in reduced feature size applications where metal lines 200 are closely spaced to one another.

In another alternative embodiment, offset gas inlet 34 and the associated gas delivery system including sources 52 and 54 of FIG. 1 are not provided. In this embodiment, the thin film deposited originates from insert 110. As an example, in the case where insert 110 is an Al/Li alloy, a thin lithium film is deposited on substrate 12. Accordingly, thin films of any desired material can be deposited by using the appropriate insert.

Although the present invention has been described with reference to preferred embodiments, persons skilled in the art will recognize that changes may be made in form and detail without departing from the spirit and scope of the invention. For example, referring to FIG. 1, shield 100 can be in shapes other than a cone, e.g. a single ended hollow cylinder. Thus, the invention is limited only by the following claims.

I claim:

1. An apparatus for forming a film on a substrate comprising:
    a first gas inlet;
    an insert attached to said first gas inlet, said insert comprising a deposition source material;
    a chamber comprising an electrically insulating material; and
    an electrode adjacent an exterior surface of said chamber.

2. The apparatus of claim 1 wherein said insert is shaped as a hollow open ended cylinder.

3. The apparatus of claim 2 wherein the outer surface of said insert forms a compression fit with the inner surface of said first gas inlet.

4. The apparatus of claim 1 wherein said insert comprises lithium.

5. The apparatus of claim 1 wherein said first gas inlet comprises an electrically conductive material, said apparatus further comprising a power supply coupled to said first gas inlet and said electrode.

6. The apparatus of claim 1 further comprising:
    a door capable of forming a vacuum seal with a first end of said chamber; and
    a substrate holder mounted on said door.

7. The apparatus of claim 6 further comprising:
    a face plate capable of forming a vacuum seal with a second end of said chamber;
    a pumping plenum attached on a first end to said face plate; and
    a T-coupler attached on a first end to a second end of said pumping plenum;
        wherein said first gas inlet extends through said pumping plenum and said T-coupler; and
        wherein a vacuum seal is formed between said first gas inlet and a second end of said T-coupler.

8. The apparatus of claim 1 further comprising a vacuum pump for reducing the pressure inside of said chamber.

9. The apparatus of claim 1 further comprising a first process gas source coupled to said first gas inlet.

10. The apparatus of claim 9 wherein said first process gas source provides a first process gas comprising an inert gas.

11. The apparatus of claim 1 further comprising a second gas inlet coupled to a second process gas source.

12. The apparatus of claim 11 wherein said second process gas source provides a second process gas comprising a plasma polymerizable material.

13. The apparatus of claim 12 wherein said plasma polymerizable material is hexamethyldisiloxane (HMDSO).

14. The apparatus of claim 11 wherein said second process gas source provides a second process gas comprising a first gas component and a second gas component, said first gas component being a reactive gas, said second gas component being a plasma polymerizable material.

15. The apparatus of claim 11 wherein said second process gas source comprises a container of organosilicon liquid, the apparatus further comprising:

a vaporizer/flowcontroller system capable of vaporizing said organosilicon liquid into organosilicon vapor and capable of controlling a flowrate of said organosilicon vapor.

16. The apparatus of claim 15 wherein said vaporizer/flowcontroller system comprises:

a first valve;

a second valve; and a heated tube coupled on a first end to said first valve and coupled on a second end to said second valve.

17. The apparatus of claim 1 further comprising a shield attached to said first gas inlet.

18. The apparatus of claim 17 wherein said shield surrounds an end of said first gas inlet.

19. The apparatus of claim 18 wherein said shield is a cone having an apex attached to said first gas inlet.

20. The apparatus of claim 17 wherein said shield and said first gas inlet are electrically conductive, said shield being electrically connected to said first gas inlet.

21. An apparatus for forming a film on a substrate comprising:

a first gas inlet;

an insert attached to said first gas inlet, said insert comprising a deposition source material; and a shield attached to said first gas inlet, said first gas inlet and said shield being electrically conductive and being electrically coupled to one another.

22. The apparatus of claim 21 wherein said insert comprises a polymeric material.

23. The apparatus of claim 22 wherein said polymeric material is selected from the group consisting of polyethylene, polypropylene and polytetrafluoroethylene.

* * * * *